United States Patent [19]
Yamauchi

[11] Patent Number: 5,424,232
[45] Date of Patent: Jun. 13, 1995

[54] METHOD FOR MANUFACTURING A NON-VOLATILE MEMORY HAVING A FLOATING GATE OXIDE TYPE FET PROVIDED WITH A TUNNEL OXIDE FILM

[75] Inventor: Yoshimitsu Yamauchi, Nara, Japan

[73] Assignee: Sharp Kabushiki Kaisha, Osaka, Japan

[21] Appl. No.: 806,296

[22] Filed: Dec. 13, 1991

[30] Foreign Application Priority Data

Dec. 18, 1990 [JP] Japan .................. 2-417966

[51] Int. Cl.6 .......................... H01L 21/265
[52] U.S. Cl. ........................... 437/43; 437/49
[58] Field of Search ............... 437/43, 44, 49; 257/314–325, 298, 900; 365/185

[56] References Cited

U.S. PATENT DOCUMENTS

| | | | |
|---|---|---|---|
| 4,775,642 | 10/1988 | Chang et al. | 437/44 |
| 4,804,637 | 2/1989 | Smayling et al. | 437/52 |
| 4,806,201 | 2/1989 | Mitchell et al. | 437/43 |
| 4,849,369 | 7/1989 | Jeuch et al. | 437/43 |
| 4,885,259 | 12/1989 | Osinski et al. | 437/43 |
| 5,021,848 | 6/1991 | Chiu | 437/44 |
| 5,146,291 | 9/1992 | Watabe et al. | 437/44 |
| 5,168,072 | 12/1992 | Moslehi | 437/44 |
| 5,208,174 | 5/1993 | Mori | 437/43 |
| 5,210,047 | 5/1993 | Woo et al. | 437/43 |
| 5,229,311 | 7/1993 | Lai et al. | 437/43 |

FOREIGN PATENT DOCUMENTS 63-257277A 10/1988 Japan ..................... 437/43

Primary Examiner—Olik Chaudhuri
Assistant Examiner—H. Jey Tsai
Attorney, Agent, or Firm—Nixon & Vanderhye

[57] ABSTRACT

A non-volatile memory having a Floating Gate Oxide type field effect transistor provided with a floating gate on a semiconductor substrate through a tunnel oxide film, including an oxide blocking film formed on the side wall of the floating gate for preventing a tunnel insulating film from being thermally oxidized by thermal oxidation.

6 Claims, 6 Drawing Sheets

METHOD FOR MANUFACTURING A NON-VOLATILE MEMORY HAVING A FLOATING GATE OXIDE TYPE FET PROVIDED WITH A TUNNEL OXIDE FILM

BACKGROUND OF THE INVENTION

1. Field of the Invention

The present invention relates to a non-volatile memory having a FLOTOX (Floating Gate Oxide) type field effect transistor provided with a floating gate on a semiconductor substrate through a tunnel oxide film; and a method for manufacturing the same, and more particularly to the improvement of a tunnel window for injecting charges to the floating gate through the tunnel oxide film so as to perform data programming.

2. Description of the Prior Art

Conventionally, there has been known a non-volatile memory for injecting charges to a floating gate through a tunnel oxide film and accumulating the same therein, and for changing the threshold of a FLOTOX type FET (field effect transistor) so as to store information, which is shown in FIG. 16.

As shown in FIG. 16, a non-volatile memory mainly comprises a FLOTOX type FET 40 provided with a SiO_2 tunnel oxide film 24a, and a FET 41 for selecting the FLOTOX type FET 40 on a P-type Si substrate 21 provided with the N+ diffused layer 30 of a source-drain having As ions.

The FLOTOX type FET 40 includes a polysilicon floating gate 28 provided on the Si substrate 21 through the tunnel oxide film 24a, and a polysilicon control gate 32 provided on the floating gate 28 through a $SiO_2$ thermal oxide film 31 so as to cover the floating gate 28.

The FET 41 includes a selective gate 27 and a $SiO_2$ gate oxide film 22c on the Si substrate 21 on which the FLOTOX type FET 40 is formed. The selective gate 27 is provided through the $SiO_2$ gate oxide film 22c having a greater thickness than that of the tunnel oxide film 24a. The $SiO_2$ thermal oxide film 31 covers the selective gate 27.

A window 50 for writing and erasing is formed on a floating gate end on the FET 41 side in the tunnel oxide film 24a.

There will be described a manufacturing method.

At first, a $SiO_2$ oxide film 22 is formed at a thickness of 300 Å over a P-type Si substrate 21 by a known thermal oxidation method so as to function as the gate oxide film 22c of a FET 41 [see FIGS. 10 and 16].

Then, a resist pattern 20 is formed on the $SiO_2$ oxide film 22 by a photoetching technology. The $SiO_2$ oxide film 22 in a region 23 which at least includes a floating gate formation region, is removed by using the resist pattern 20 as a mask [see FIG. 11].

In that case, a $SiO_2$ film 22b remains in a region S in which the FET 41 is formed. In addition, a $SiO_2$ film 22a is caused to remain in a region T opposed to the $SiO_2$ film 22b with the region 23 interposed therebetween. Then, the resist pattern 20 is removed.

Thereafter, a tunnel oxide film ($SiO_2$ film) 24 is formed at a thickness of 80 Å in the region 23 by the known thermal oxidation method [see FIG. 12].

A polysilicon layer 25 having a thickness of 2000 Å is laminated on the $SiO_2$ films 22a, 22b and 24. Resist patterns 26a and 26b for forming a floating gate and a selective gate are formed on the polysilicon layer 25 [see FIG. 13].

As shown in FIG. 14, the polysilicon layer 25 is removed with the use of the resist patterns 26a and 26b as masks by the photoetching technology so as to form a floating gate 28 add a selective gate 27. Then, As ions 29 are implanted so as to form N+ diffused layers 30 by high temperature annealing for 30 minutes at a temperature of 900° C. [see FIG. 14].

In that case, a tunnel window 50 is formed on a self-aligning basis on the tunnel oxide film 24 on the selective gate 27 side just below a floating gate 28 end.

Subsequently, the $SiO_2$ films 24, 22a and 22b are removed by using the selective gate 27 and floating gate 28 as masks [see FIG. 15]. The $SiO_2$ films 22c and 24a remaining just below the selective gate 27 and floating gate 28 are their gate oxide film 22c and tunnel oxide film 24a, respectively. As described above, the tunnel oxide film 24a has the window 50 provided just below the floating gate 28 end on the selective gate 27 side.

Finally, the Si substrate 21 including the gates 27 and 28 is subjected to thermal oxidation so as to form a $SiO_2$ film 31 having a thickness of 200 Å as a gate oxide film for a control gate. More specifically, the $SiO_2$ thermal oxide film 31 is formed so as to cover the N+ diffused layers 30, the selective gate 27 and the floating gate 28. Then, a polysilicon layer is laminated at a thickness of 2000 Å over the thermal oxide film 31. Thereafter, a control gate 32 is formed by patterning on the floating gate 28 through the thermal oxide film 31. Thus, a memory is manufactured [see FIG. 16].

The thermal oxide film 31 as the gate oxide film for the control gate 32 is formed by the thermal oxidation method. Referring to the prior art, the Si substrate 21 including the gates 27 and 28 is subjected to thermal oxidation with the $SiO_2$ film 22c and the $SiO_2$ film 24a having the tunnel window 50, which have different thicknesses, included therein as shown in FIG. 15. Consequently, a floating gate end 28a on the selective gate 27 side is raised upward [see FIG. 16]. As a result, the thickness of the tunnel oxide film 24a having the window for writing and erasing becomes greater than before thermal oxidation. In the tunnel window 50, the above-mentioned tendency is particularly marked, so that writing and erasing characteristics may be deteriorated.

It is an object of the present invention to provide a non-volatile memory capable of preventing a floating gate end from being raised when forming a gate oxide film for a floating gate by thermal oxidation, and a method for manufacturing the same.

SUMMARY OF THE INVENTION

The present invention provides a non-volatile memory having a Floating Gate Oxide type field effect transistor provided with a floating gate on a semiconductor substrate through a tunnel oxide film, comprising an oxide blocking film formed on the side wall of the floating gate for preventing a tunnel insulating film from being thermally oxidized by thermal oxidation.

From another aspect, the present invention provides a method for manufacturing a non-volatile memory having a Floating Gate Oxide type field effect transistor provided with a tunnel oxide film, comprising the steps of forming a floating gate on a semiconductor substrate through a tunnel insulating film and implanting ions by using the floating gate as a mask so as to form an impurity diffused layer, forming a thermal oxide blocking layer over the semiconductor substrate including the floating gate and etching back the same so as to form an oxide blocking film on the side wall of the floating gate, and forming an insulating film for a control gate on the floating gate by thermal oxidation so as to form the control gate.

PREFERRED EMBODIMENT

The present invention is characterized in that there is formed on the side wall of a floating gate an oxide blocking film for preventing a tunnel insulating film from being thermally oxidized by thermal oxidation. Consequently, even if a control gate is formed, the thickness of a tunnel oxide film is not made greater. Thus, it is possible to prevent writing and erasing characteristics from being deteriorated.

More specifically, there is at least formed on the floating gate the side wall of the oxide blocking film for oxidizing the tunnel oxide film in advance before a gate oxide film for a control gate is formed by thermal oxidation. Consequently, it is possible to prevent both ends of the tunnel oxide film provided just below the floating gate from being raised owing to the thermal oxidation. As a result, the thickness of the tunnel oxide film can be prevented from being increased. Thus, the thickness of a tunnel window on a tunnel oxide film end can also be prevented from being varied, so that it is possible to prevent the writing and erasing characteristics from being deteriorated. An example of the oxide blocking film according to the present invention is a SiN film.

A preferred embodiment of the present invention will be described in detail with reference to the drawings. The present invention is not limited to the following embodiment.

Figure 9:
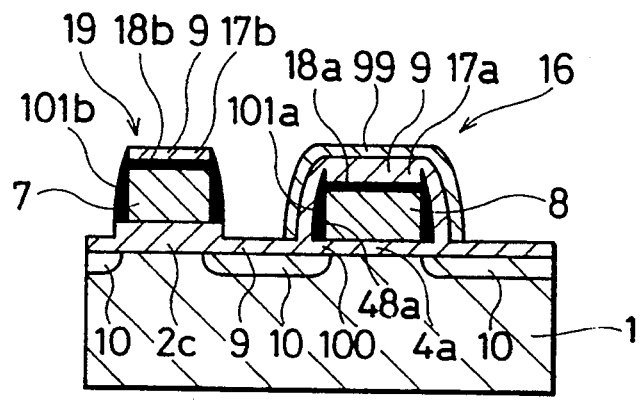
FIG. 9 is a view showing a ninth step of the manufacturing process according to the embodiment of the present invention, and the structure of a non-volatile memory according to an embodiment of the present invention.
Figure 10:
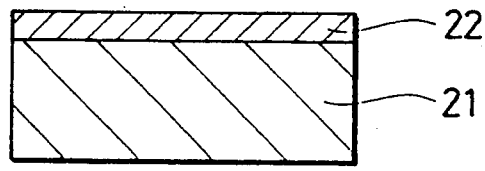
FIG. 10 is a view showing a first step of manufacturing process according to the prior art.
Figure 11:
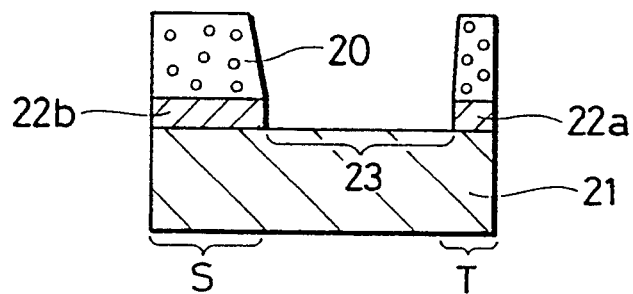
FIG. 11 is a view showing a second step of the manufacturing process according to the prior art.
Figure 12:
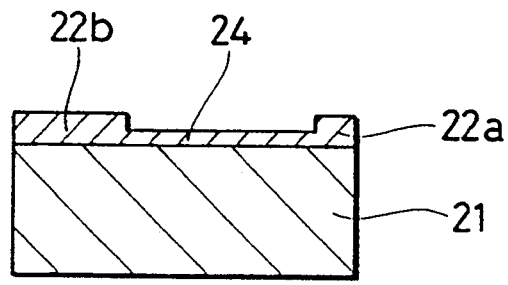
FIG. 12 is a view showing a third step of the manufacturing process according to the prior art.
Figure 13:
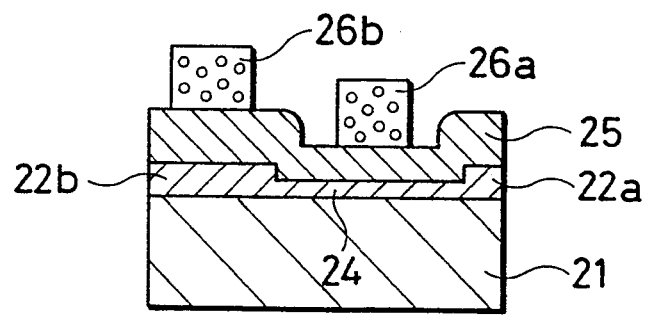
FIG. 13 is a view showing a fourth step of the manufacturing process according to the prior art.
Figure 14:
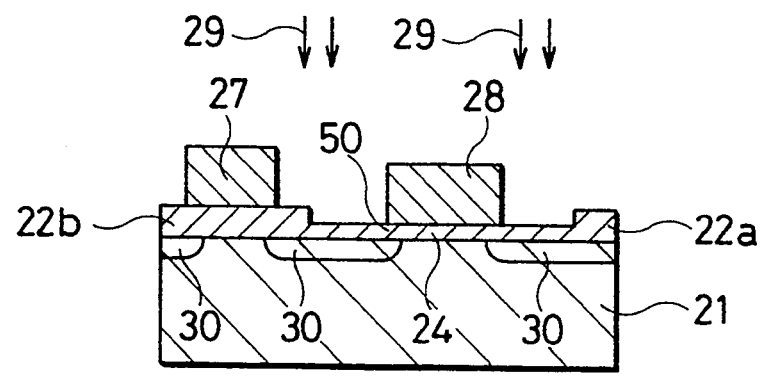
FIG. 14 is a view showing a fifth step of the manufacturing process according to the prior art.
Figure 15:
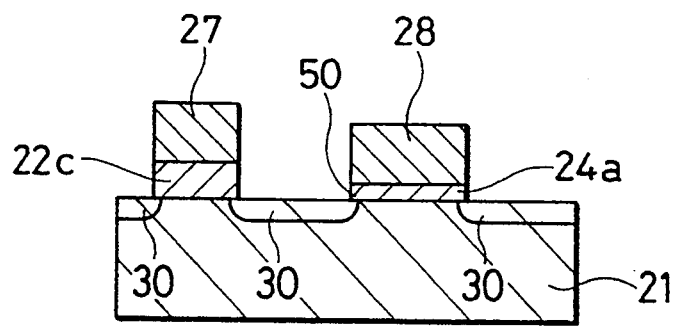
FIG. 15 is a view showing a sixth step of the manufacturing process according to the prior art.
Figure 16:
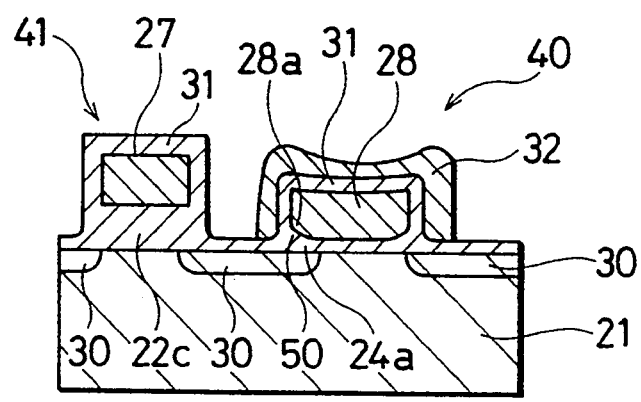
FIG. 16 is a view showing a seventh step of the manufacturing process, and the structure of a non-volatile memory according to the prior art.

FIG. 9 shows a non-volatile memory according to an embodiment of the present invention, in which charges are injected to a floating gate through a tunnel oxide film and accumulated therein, and the threshold of a FET is changed to store information.

In FIG. 9, the non-volatile memory comprises a FLOTOX type FET 16 and a FET 19 on a P-type Si substrate 1 provided with the $N^+$ diffused layer 10 of a source-drain having As ions. The FLOTOX type FET 16 includes a tunnel oxide film 4a. The FET 19 serves to select the FLOTOX type FET 16.

The FLOTOX type FET 16 includes a floating gate 8 and a control gate 99. The floating gate 8 is provided on the Si substrate 1 through the tunnel oxide film 4a and has a SiN side wall 101a. The control gate 99 is provided on the floating gate 8 through an ON film 18a, a $SiO_2$ oxide film 17a and a $SiO_2$ thermal oxide film (gate oxide film for the control gate) 9.

The FET 19 includes a selective gate 7, and an ON film 18b, a $SiO_2$ oxide film 17b and a $SiO_2$ thermal oxide film 9 for covering the selective gate 7. The selective gate 7 has a SiN side wail 101b and is provided on the Si substrate 1, on which the FLOTOX type FET 16 is formed, through a $SiO_2$ gate oxide film 2c having a greater thickness than that of the tunnel oxide film 4a.

A window 100 for writing and erasing is formed on a floating gate 8 end on the FET 19 side in the tunnel oxide film 4a.

In the case where the gate oxide film 9 for the control gate is to be formed by thermal oxidation, the window 100 is controlled by the SiN side wall 101a of the floating gate 8 such that the thickness of the tunnel oxide film 4a is not increased, which is to be described below.

There will be described a manufacturing method.

Figure 1:
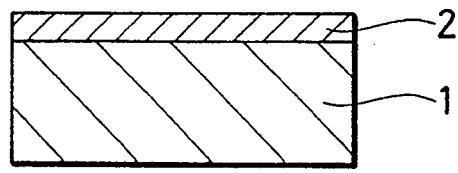
FIG. 1 is a view showing a first step of manufacturing process according to an embodiment of the present invention.
Figure 8:
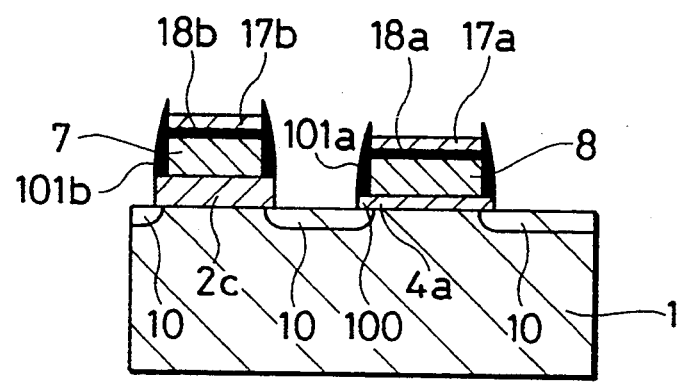
FIG. 8 is a view showing an eighth step of the manufacturing process according to the embodiment of the present invention.

At first, a $SiO_2$ oxide film 2 is formed at a thickness of 300 Å on a P-type Si substrate 1 by a thermal oxidation method so as to function as the gate oxide film 2c of a FET 19 [see FIGS. 1, 8 and 9].

Figure 2:
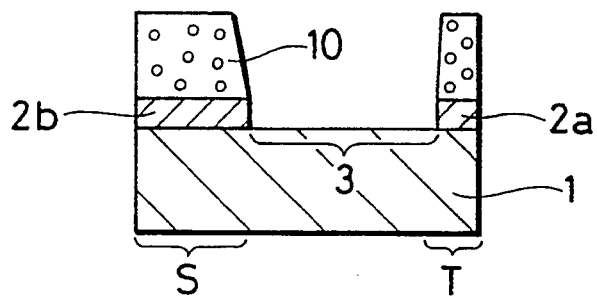
FIG. 2 is a view showing a second step of the manufacturing process according to the embodiment of the present invention.

Then, a resist pattern 10 is formed on the $SiO_2$ oxide film 2 by a photoetching technology. The $SiO_2$ oxide film 2 in a region 3, which at least includes a floating gate formation regions, is removed by using the resist pattern 10 as a mask [see FIG. 2].

In that case, a $SiO_2$ film 2b remains in a region $\underline{S}$ in which the FET 19 is formed. In addition, a $SiO_2$ film 2a is caused to remain in a region $\underline{T}$ opposed to the $SiO_2$ film 2b with the region 3 interposed therebetween. Then, the resist pattern 10 is removed.

Figure 3:
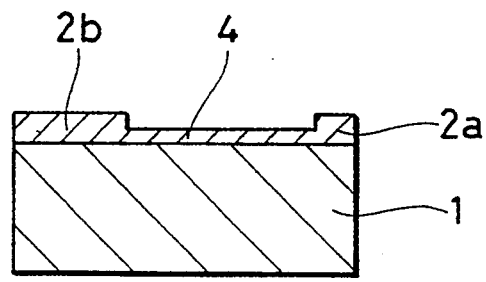
FIG. 3 is a view showing a third step of the manufacturing process according to the embodiment of the present invention.

Thereafter, a tunnel oxide film ($SiO_2$ film) 4 is formed at a thickness of 80 Å in the region 3 by the thermal oxidation method [see FIG. 3].

Figure 4:
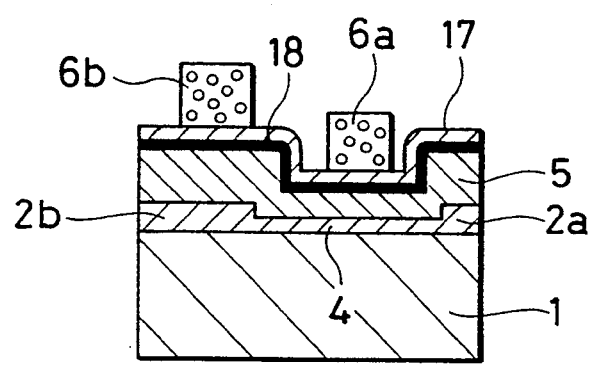
FIG. 4 is a view showing a fourth step of the manufacturing process according to the embodiment of the present invention.

A polysilicon layer 5 is laminated at a thickness of 2000 Å on the $SiO_2$ films 2a 2b and 4. A $SiO_2$ film having a thickness of 100 Å and a SiN film having a thickness of 100 Å are sequentially laminated on the polysilicon layer 5 so as to form an ON film 18 as an insulating film. Then, a $SiO_2$ oxide film 17 having a thickness of 30 Å is laminated on the ON film 18. Thereafter, resist patterns 6a and 6b for forming a floating gate and a selective gate are formed on the SiO₂ film 17 [see FIG. 4].

Figure 5:
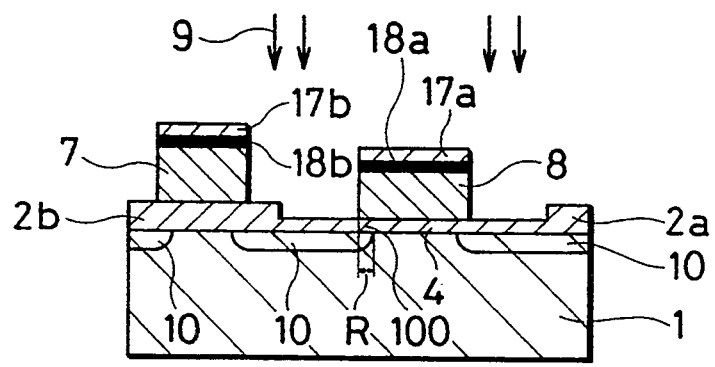
FIG. 5 is a view showing a fifth step of the manufacturing process according to the embodiment of the present invention.

Subsequently, the SiO₂ film 17, ON film 18 and polysilicon film 5 are sequentially removed with the use of the resist patterns 6a and 6b as masks by the photo-etching technology. A floating gate 8 and a selective gate 7 are formed with the SiO₂ films 17a, 17b and the ON films 18a, 18b sequentially remaining thereon. Then, As ions 9 are implanted to form N+ diffused layers 10 by high temperature annealing for 30 minutes at a temperature of 900° C. [see FIG. 5]. In this case, a tunnel window (for writing and erasing) 100 is formed on a self-aligning basis on the tunnel oxide film 4 on the selective gate 7 side just below a floating gate 8 end. In FIG. 5, the reference numeral 100 denotes a tunnel window having a thickness of 140 Å which is formed on the tunnel oxide film 4. A region R is a tunnel window region.

Figure 6:
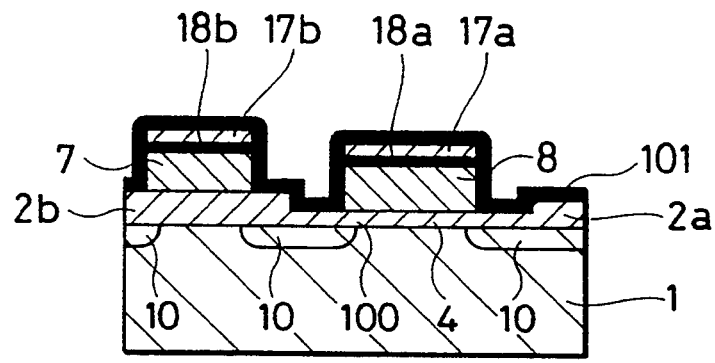
FIG. 6 is a view showing a sixth step of the manufacturing process according to the embodiment of the present invention.

A SiN film 101 having a thickness of 100 Å is laminated by a CVD method over the Si substrate 1 including the floating gate 8 and the selective gate 7 [see FIG. 6].

Figure 7:
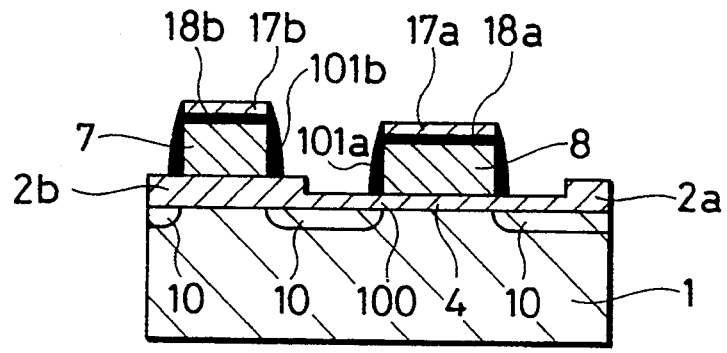
FIG. 7 is a view showing a seventh step of the manufacturing process according to the embodiment of the present invention.

Then, SiN side walls 101a and 101b are formed on the gates 8 and 7 by etching back the SiN film 101, respectively [see FIG. 7]. In this case, it is preferred that the SiN film 101 is removed by etchback until the surfaces of the SiO₂ films 4, 2a and 2b are exposed. The SiN film 101 can be removed by anisotropic dry etching.

Thereafter the SiO₂ films 4, 2a and 2b are removed by using the selective gate 7 and floating gate 8 as masks [see FIG. 8]. The SiO₂ films 2c and 4a remaining just below the selective gate 7 and floating gate 8 are their gate oxide film 2c and tunnel oxide film 4a, respectively. As described above, the tunnel oxide film 4a has the window 100 for writing and erasing provided just below the floating gate 8 end on the selective gate 7 side.

Finally, the Si substrate 1 including the gates 7 and 8 is thermally oxidized to form a SiO₂ film 9 having a thickness of 140 Å as a gate oxide film for a control gate [see FIG. 9]. More specifically, the thermal oxide SiO₂ film 9 covers the N+ diffused layers 10 and forms the uppermost layer on the selective gate 7. Then, a polysilicon layer is laminated at a thickness of 2000 Å over the whole surface as shown in FIG. 9. Thereafter, a control gate 99 is formed by patterning. Thus, a memory is manufactured.

According to the present embodiment, there is formed on the side wall of the floating gate 8 the SiN film 101a for preventing the tunnel insulating film 4a from being thermally oxidized by thermal oxidation. Consequently, even if the control gate 99 is formed, the thickness of the tunnel oxide film 4a is not increased. In particular, it is possible to prevent a floating gate end 48a on the selective gate 7 side from being raised upward. Consequently, the thickness of the window 100 is not increased. Thus, the writing and erasing characteristics can be prevented from being deteriorated.

According to the present invention, there is provided a non-volatile memory having a FLOTOX type field effect transistor provided with a tunnel oxide film, in which a SiN oxide blocking film is formed on the side wall of a floating gate and a gate oxide film for a control gate is then formed by thermal oxidation. The SiN oxide blocking film is formed on the side wall of the floating gate, so that the floating gate can be prevented from being raised when forming the gate oxide film for the control gate. Consequently, there is not increased the thickness of a tunnel insulating film which is provided just below the floating gate. Thus, writing and erasing characteristics can be prevented from being deteriorated.

What is claimed is:

1. A method for manufacturing a non-volatile memory having a Floating Gate Oxide field effect transistor and a selective transistor for selecting the Floating Gate Oxide field effect transistor, comprising the steps of:

forming a floating gate on a tunnel insulating film overlying a semiconductor substrate, forming a selective gate for the selective transistor on an insulator thicker than the tunnel insulating film, implanting ions using the floating gate and the selective gate as a mask and then forming an impurity diffused layer in the substrate, forming an oxidation resistance layer over the floating gate, etching back the oxidation resistance layer so as to form an oxidation resistance film on a side wall of the floating gate, and forming an insulating film for a control gate on the floating gate by oxidation so as to form the control gate, wherein a thickness of the tunnel insulating film covered by the floating gate and the oxidation resistance layer remains constant.

2. A method for manufacturing a non-volatile memory according to claim 1, wherein the oxidation resistance layer is a SiN layer and the oxidation resistance film is a SiN film.

3. A method for manufacturing a memory comprising:

(a) forming an insulation film over a semiconductor substrate;

(b) in an area of the insulation film, forming a tunnel oxide film that is thinner than the insulation film;

(c) forming a floating gate electrode on the tunnel oxide film;

(d) forming a selective gate electrode on the insulating film;

(e) implanting ions to form diffused impurity regions in the substrate on either side of the floating gate electrode;

(f) directly forming an oxidation resistance layer on sidewalls of the floating gate electrode; and (g) etching the oxidation resistance layer to form an oxidation resistance film;

(h) thermally oxidizing the substrate and an upper portion of the floating gate electrode, wherein a thickness of the tunnel oxide film is maintained constant throughout thermal oxidation.

4. The method according to claim 3 further comprising:

covering the floating gate electrode with an insulator; and forming a control gate electrode over the floating gate electrode, wherein the thickness of the tunnel oxide film is not increased by forming the insulator.

5. The method according to claim 3, wherein before step (f) an oxidation resistance layer is formed on the side of the floating gate and thereafter the oxidation resistance layer is etched to form the oxidation resistance film.

6. The method according to claim 3, wherein the oxidation resistance film prevents ends of the gate electrode from moving upward away from the substrate during thermal oxidation.

* * * * *